United States Patent
Li et al.

(10) Patent No.: US 10,270,470 B2
(45) Date of Patent: Apr. 23, 2019

(54) POLAR CODE DECODING METHOD AND DECODER

(71) Applicant: Huawei Technologies Co., Ltd., Shenzhen, Guangdong (CN)

(72) Inventors: Bin Li, Shenzhen (CN); Hui Shen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 142 days.

(21) Appl. No.: 14/845,565

(22) Filed: Sep. 4, 2015

(65) Prior Publication Data
US 2015/0381208 A1     Dec. 31, 2015

Related U.S. Application Data (63) Continuation of application No. PCT/CN2014/070206, filed on Jan. 7, 2014.

(30) Foreign Application Priority Data

Mar. 7, 2013 (CN) .......................... 2013 1 0073607

(51) Int. Cl.
*H03M 13/00* (2006.01)
*H03M 13/15* (2006.01)
(Continued)

(52) U.S. Cl.
CPC ....... *H03M 13/1575* (2013.01); *H03M 13/13* (2013.01); *H03M 13/2906* (2013.01); *H03M 13/616* (2013.01); *H03M 13/6561* (2013.01)

(58) Field of Classification Search
CPC ......... H03M 13/1575; H03M 13/6561; H03M 13/2906; H03M 13/616; H03M 13/13
(Continued)

(56) References Cited

U.S. PATENT DOCUMENTS 4,583,194 A  *  4/1986   Cage ................... G06F 3/0601
                                                        710/22
6,594,792 B1     7/2003   Hladik et al.
(Continued)

FOREIGN PATENT DOCUMENTS

CN       101707510 A      5/2010
CN       101777924 A      7/2010
(Continued)

OTHER PUBLICATIONS

P. Trifonov, "Efficient Design and Decoding of Polar Codes," in IEEE Transactions on Communications, vol. 60, No. 11, pp. 3221-3227, Nov. 2012.*
(Continued)

*Primary Examiner* — Cynthia Britt (57) ABSTRACT

Embodiments of the present invention provide a Polar code decoding method and decoder. The decoding method includes: segmenting a first Polar code having a length of N into m mutually coupled second Polar codes, where a length of each second Polar code is N/m, N and m are integer powers of 2, and N>m; independently decoding the m second Polar codes to acquire decoding results of the m second Polar codes; and obtaining a decoding result of the first Polar code according to the decoding results of the m second Polar codes. In the embodiments of the present invention, a Polar code having a length of N is segmented into multiple segments of mutually coupled Polar codes; the segmented Polar codes are independently decoded; and results of the independent decoding are jointly processed to obtain a decoding result of an original Polar code.

19 Claims, 4 Drawing Sheets

(51) Int. Cl.
   *H03M 13/13* (2006.01)
   *H03M 13/29* (2006.01)
(58) Field of Classification Search
   USPC .................................................. 714/752, 776
   See application file for complete search history.

(56) References Cited

U.S. PATENT DOCUMENTS

| | | | |
|---|---|---|---|
| 7,218,677 | B2 | 5/2007 | Otsuka |
| 8,347,186 | B1 | 1/2013 | Arikan |
| 9,667,381 | B2* | 5/2017 | Jeong .................... H04L 1/0046 |
| 2010/0027903 | A1 | 2/2010 | Takamura |
| 2010/0061271 | A1 | 3/2010 | Seyedi-Esfahani et al. |
| 2011/0261908 | A1 | 10/2011 | Chiang et al. |
| 2012/0054576 | A1 | 3/2012 | Gross et al. |
| 2013/0111291 | A1* | 5/2013 | Ma ........................ H04L 1/0009 714/752 |
| 2013/0117344 | A1 | 5/2013 | Gross et al. |
| 2013/0283116 | A1* | 10/2013 | Arikan .................. H03M 13/13 714/752 |
| 2014/0365842 | A1 | 12/2014 | Li et al. |
| 2015/0026543 | A1 | 1/2015 | Li et al. |
| 2015/0381208 | A1 | 12/2015 | Li et al. |
| 2016/0269050 | A1* | 9/2016 | Shen ..................... H03M 13/13 |

FOREIGN PATENT DOCUMENTS

| | | |
|---|---|---|
| CN | 102122966 A | 7/2011 |
| CN | 102394663 A | 3/2012 |
| CN | 103220001 A | 7/2013 |
| CN | 103368583 A | 10/2013 |
| CN | 104038234 A | 9/2014 |
| CN | 104124979 A | 10/2014 |
| EP | 1942578 A1 | 7/2008 |
| KR | 20080048971 A | 6/2008 |
| KR | 20090110310 A | 10/2009 |
| KR | 20130001494 A | 1/2013 |
| RU | 2406222 C1 | 12/2010 |
| SU | 1711337 A1 | 2/1992 |
| WO | 2013107140 A1 | 7/2013 |
| WO | 2013152605 A1 | 10/2013 |

OTHER PUBLICATIONS

S. Kahraman and M. E. çelebi, "Code based efficient maximum-likelihood decoding of short polar codes," 2012 IEEE International Symposium on Information Theory Proceedings, Cambridge, MA, 2012, pp. 1967-1971.*

Erdal Arikan, "Channel Polarization: A Method for Constructing Capacity-Achieving Codes for Symmetric Binary-Input Memoryless Channels", IEEE Transactions on Information Theory, vol. 55, No. 7, Jul. 2009, p. 3051-3073.

Ido Tal, et al., "List Decoding of Polar Codes", 2011 IEEE International Symposium on Information Theory Proceedings, 2011, 5 pages.

Viveck R. Cadambe, et al., "Interference Alignment and Spatial Degrees of Freedom for the K User Interference Channel", IEEE, 2008, p. 971-975.

Camille Leroux, et al., "A Semi-Parallel Successive-Cancellation Decoder for Polar Codes", IEEE Transactions on Signal Processing, vol. 61, No. 2, Jan. 15, 2013, p. 289-299.

Bin Li, et al., "Parallel Decoders of Polar Codes", Sep. 4, 2013, 4 pages.

Alptekin Pamuk, "An FPGA Implementation Architecture for Decoding of Polar Codes", 2011 8th International Symposium on Wireless Communication Systems, Nov. 6, 2011, p. 437-441.

Mathis Seidl et al., "Improving Successive Cancellation Decoding of Polar Codes by Usage of Inner Block Codes", Sep. 10, 2010, 4 pages.

Ryuhei Mori, "On Polar Codes", Technical Research Report of Institute of Electronics, Information and Communication Engineers, vol. 110, No. 205, Sep. 14, 2010, p. 43-49.

Camille Leroux et al., "Hardware Architecture for Successive Cancellation Decoding of Polar Codes", 2011 IEEE International Conference on Acoustics, Speech and Signal Processing, May 27, 2011, p. 1665-1668.

Chuan Zhang et al., "Reduced-Latency SC Polar Decoder Architectures", 2012 Signal Proceeesing for Communications Symposium, Jun. 15, 2012, p. 3471-3475.

Bin Li et al., "Low-Latency Polar Codes via Hybrid Decoding", 2014 8th International Symposium on Turbo Codes and Iterative Information Processing (ISTC), IEEE, 2014, p. 223-227.

Guohui Wang et al., "High Throughput Low Latency LDPC Decoding on GPU for SDR Systems", GlobalSIP 2013, p. 1258-1261.

Amin Alamdar-Yazdi et al., "A Simplified Successive-Cancellation Decoder for Polar Codes", IEEE Communications Letters, vol. 15, No. 12, Dec. 2011, p. 1378-1380.

Kai Niu et al., "New Repetition Polar Code over Double Blocks for the BEC Channel", IEEE Wireless Information Technology and Systems, 2012 IEEE International Conference, Nov. 2012, 4 pages.

A. Mishra et al., "A Successive Cancellation Decoder ASIC for a 1024-bit Polar Code in 180nm CMOS", IEEE Asian Solid-State Circuits Conference, Nov. 12-14, 2012, p. 205-208.

Sinan Kahraman et al., "Folded Tree Maximum-Likelihood Decoder for Kronecker Product-Based Codes", Fifty=first Annual Allerton Conference, Oct. 2-3, 2013, p. 629-636, XP032565227.

Nadine Hussami, "Performance of Polar Codes for Channel and Source Coding", International Symposium on Information Theory, ISIT 2009, Jun. 28-Jul. 3, 2009, p. 1488-1492, XP031513582.

Peter Trifonov et al., "Generalized Concatenated Codes Based on Polar Codes", 8th International Symposium on Wireless Communication Systems (ISWCS), IEEE, Nov. 6, 2011, pp. 442-446, XP032090122.

* cited by examiner

POLAR CODE DECODING METHOD AND DECODER

CROSS-REFERENCE TO RELATED APPLICATIONS

This application is a continuation of International Application No. PCT/CN2014/070206, filed on Jan. 7, 2014, which claims priority to Chinese Patent Application No. 201310073607.8, filed on Mar. 7, 2013, both of which are hereby incorporated by reference in their entireties.

TECHNICAL FIELD

Embodiments of the present invention relate to the coding and decoding field, and more specifically, to a Polar code decoding method and decoder.

BACKGROUND

Channel coding is commonly used in a communications system to improve data transmission reliability and ensure communication quality. A Polar code is a coding manner that can approach a Shannon capacity and low coding and decoding complexity. The Polar code is a linear block code. A generator matrix of the Polar code is $G_N$, and a coding process of the Polar code is that $x_1^N = u_1^N G_N$, where $G_N = B_N F^{\otimes n}$, a code length $N=2n$, and $n \geq 0$.

Herein, $$F = \begin{bmatrix} 1 & 0 \\ 1 & 1 \end{bmatrix},$$

and $B_N$ is a transposed matrix, for example, a bit reversal matrix.

$F^{\otimes n}$ is a Kronecker power of F and is defined as $F^{\otimes n} = F \otimes F^{\otimes (n-1)}$. The Polar code may be expressed as $(N, K, A, u_{A^C})$ by using a coset code. A coding process of the Polar code is that: $x_1^N = u_A G_N(A) \oplus u_{A^C} G_N(A^C)$, where A is a set of information bit indexes, and $G_N(A)$ is a submatrix that is in the $G_N$ and obtained from a line corresponding to an index in the set A, and $G_N(A^C)$ is a submatrix that is in the $G_N$ and obtained from a line corresponding to an index in a set $A^C$. $u_{A^C}$ $u_{A^C}$ are frozen bits, which are known bits, and a quantity of $u_{A^C}$ is (N-K). For simplicity, these frozen bits may be set to 0.

SC (successive-cancellation) decoding may be used in Polar code decoding, where a decoding process may be as follows:

A Polar code is considered, where a parameter of the Polar code is $(N, K, A, u_{A^C})$.

In SC decoding, the following conditional likelihood function is calculated in sequence:

$$L_N^{(i)}(y_1^N, \hat{u}_1^{i-1}) \triangleq \ln \frac{W_N^{(i)}(y_1^N, \hat{u}_1^{i-1} | 0)}{W_N^{(i)}(y_1^N, \hat{u}_1^{i-1} | 1)}, \quad (1)$$

where $y_1^N$ is a received signal vector $(y_1, y_2, \ldots, y_N)$, and $\hat{u}_1^{i-1}$ is a bit vector $(u_1, u_2, \ldots, u_{i-1})$. W is a transition probability, and L represents a log-likelihood ratio.

If $i \subset A$, the following decision is made:

$$\hat{u}_i = \begin{cases} 0, & \text{if } L_N^{(i)}(y_1^N, \hat{u}_1^{i-1}) \geq 0 \\ 1, & \text{otherwise} \end{cases} \quad (2)$$

If $i \subset A^C$, it is simply assumed that $\hat{u}_i = u_i$ \quad (3)

In the foregoing formulas (2) and (3), $\hat{u}_i$ represents a decision value of a bit $u_i$.

Complexity of SC decoding is O(N log 2N). In a case in which the code length N is very long, SC decoding can achieve good performance and approximately reach a Shannon limit.

However, in SC decoding, decoding can only be sequentially performed bit by bit, a hard decision is made after each bit is decoded, and then a result of the hard decision is used in subsequent bit decoding, which has relatively low flexibility.

SUMMARY

Embodiments of the present invention provide a Polar code decoding method and decoder, which can improve a decoding throughput of a Polar code.

According to a first aspect, a Polar code decoding method is provided, including: segmenting, by a decoder, a first Polar code having a length of N into m mutually coupled second Polar codes, where a length of each second Polar code is N/m, N and m are integer powers of 2, and N>m; independently decoding, by the decoder, the m second Polar codes to acquire decoding results of the m second Polar codes; and obtaining, by the decoder, a decoding result of the first Polar code according to the decoding results of the m second Polar codes.

With reference to the first aspect, in an implementation manner, the independently decoding the m second Polar codes to acquire decoding results of the m second Polar codes includes: decoding the m second Polar codes in parallel to acquire the decoding results of the m second Polar codes.

With reference to the first aspect and the foregoing implementation manner, in another implementation manner, the independently decoding the m second Polar codes to acquire decoding results of the m second Polar codes includes: acquiring a decision reference value of the $i^{th}$ bit in each second Polar code, where i is a positive integer, and $1 \leq i \leq N/m$; and deciding the $i^{th}$ bit according to the decision reference value to obtain a decision value of the $i^{th}$ bit; where the obtaining a decoding result of the first Polar code according to the decoding results of the m second Polar codes includes: obtaining, according to properties of bits that are in the first Polar code and corresponding to the $i^{th}$ bits of the m second Polar codes, decoding results of the corresponding bits in the first Polar code.

With reference to the first aspect and the foregoing implementation manners, in another implementation manner, the obtaining, according to properties of bits that are in the first Polar code and corresponding to the $i^{th}$ bits of the m second Polar codes, decoding results of the corresponding bits in the first Polar code includes: when the corresponding bits are all information bits, determining the decoding results of the corresponding bits according to the decision values of the $i^{th}$ bits of the m second Polar codes; and when a frozen bit and an information bit exist in the corresponding bits, determining the decoding results of the corresponding bits according to the decision values of the $i^{th}$ bits of the m second Polar codes and the decision reference values of the $i^{th}$ bits, or determining the decoding results of the corresponding bits according to the decision reference values of the $i^{th}$ bits of the m second Polar codes.

With reference to the first aspect and the foregoing implementation manners, in another implementation manner, the determining the decoding results of the corresponding bits according to the decision reference values of the $i^{th}$ bits of the m second Polar codes includes: performing equal-gain combining on the decision reference values of the $i^{th}$ bits of the m second Polar codes to obtain the decoding results of the corresponding bits.

With reference to the first aspect and the foregoing implementation manners, in another implementation manner, the determining the decoding results of the corresponding bits according to the decision reference values of the $i^{th}$ bits of the m second Polar codes includes: acquiring a likelihood ratio function value of each combination of the corresponding bits according to the decision reference values of the $i^{th}$ bits of the m second Polar codes; and selecting a combination that has a largest likelihood ratio function value as the decoding results of the corresponding bits.

With reference to the first aspect and the foregoing implementation manners, in another implementation manner, the decision reference value is a likelihood ratio, a log-likelihood ratio, or a probability value.

With reference to the first aspect and the foregoing implementation manners, in another implementation manner, the segmenting a first Polar code having a length of N into m mutually coupled second Polar codes includes: sequentially and equally segmenting a received signal vector of the first Polar code into m segments, where each segment of the received signal vector is used as a received signal vector of one of the second Polar codes to determine the m second Polar codes.

With reference to the first aspect and the foregoing implementation manners, in another implementation manner, the independently decoding the m second Polar codes to acquire decoding results of the m second Polar codes includes: independently performing successive-cancellation SC decoding on the m second Polar codes to acquire the decoding results of the m second Polar codes.

According to a second aspect, a Polar code decoder is provided, including: a segmenting unit, configured to segment a first Polar code having a length of N into m mutually coupled second Polar codes, where a length of each second Polar code is N/m, N and m are integer powers of 2, and N>m; a decoding unit, configured to independently decode the m second Polar codes to acquire decoding results of the m second Polar codes; and a determining unit, configured to obtain a decoding result of the first Polar code according to the decoding results of the m second Polar codes.

With reference to the second aspect, in an implementation manner, the decoding unit includes: m component decoders, which respectively receives one second Polar code of the m second Polar codes from the segmenting unit, and is configured to decode the m second Polar codes in parallel to acquire the decoding results of the m second Polar codes.

With reference to the second aspect and the foregoing implementation manner, in another implementation manner, the decoding unit is specifically configured to: acquire a decision reference value of the $i^{th}$ bit in each second Polar code, where is a positive integer, and 1≤i≤N/m; and decide the $i^{th}$ bit according to the decision reference value to obtain a decision value of the $i^{th}$ bit; and the determining unit is specifically configured to obtain, according to properties of bits that are in the first Polar code and corresponding to the $i^{th}$ bits of the m second Polar codes, decoding results of the corresponding bits in the first Polar code.

With reference to the second aspect and the foregoing implementation manners, in another implementation manner, the determining unit is specifically configured to: when the corresponding bits are all information bits, determine the decoding results of the corresponding bits according to the decision values of the $i^{th}$ bits of the m second Polar codes; and when a frozen bit and an information bit exist in the corresponding bits, determine the decoding results of the corresponding bits according to the decision values of the $i^{th}$ bits of the m second Polar codes and the decision reference values of the $i^{th}$ bits.

With reference to the second aspect and the foregoing implementation manners, in another implementation manner, the determining unit is specifically configured to: when the corresponding bits are all information bits, determine the decoding results of the corresponding bits according to the decision values of the $i^{th}$ bits of the m second Polar codes; and when a frozen bit and an information bit exist in the corresponding bits, determine the decoding results of the corresponding bits according to the decision reference values of the $i^{th}$ bits of the m second Polar codes.

With reference to the second aspect and the foregoing implementation manners, in another implementation manner, the determining unit is specifically configured to: when the corresponding bits are all information bits, determine the decoding results of the corresponding bits according to the decision values of the $i^{th}$ bits of the m second Polar codes; and when a frozen bit and an information bit exist in the corresponding bits, perform equal-gain combining on the decision reference values of the $i^{th}$ bits of the m second Polar codes to obtain the decoding results of the corresponding bits.

With reference to the second aspect and the foregoing implementation manners, in another implementation manner, the determining unit is specifically configured to: when the corresponding bits are all information bits, determine the decoding results of the corresponding bits according to the decision values of the $i^{th}$ bits of the m second Polar codes; and when a frozen bit and an information bit exist in the corresponding bits, acquire a likelihood ratio function value of each combination of the corresponding bits according to the decision reference values of the $i^{th}$ bits of the m second Polar codes, and select a combination that has a largest likelihood ratio function value as the decoding results of the corresponding bits.

With reference to the second aspect and the foregoing implementation manners, in another implementation manner, the decision reference value is a likelihood ratio, a log-likelihood ratio, or a probability value.

With reference to the second aspect and the foregoing implementation manners, in another implementation manner, the segmenting unit is specifically configured to sequentially and equally segment a received signal vector of the first Polar code into m segments, where each segment of the received signal vector is used as a received signal vector of one of the second Polar codes to obtain the m second Polar codes.

With reference to the second aspect and the foregoing implementation manners, in another implementation manner, the decoding unit is specifically configured to independently perform successive-cancellation SC decoding on the m second Polar codes to acquire the decoding results of the m second Polar codes.

In the embodiments of the present invention, a Polar code having a length of N is segmented into multiple segments of mutually coupled Polar codes; the segmented Polar codes are independently decoded; and results of the independent decoding are jointly processed to obtain a decoding result of an original Polar code; in this way, there is no need to sequentially decode N bits, and flexibility of Polar code decoding can be improved.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are apart rather than all of the embodiments of the present invention. All other embodiments obtained by a person of ordinary skill in the art based on the embodiments of the present invention without creative efforts shall fall within the protection scope of the present invention.

The embodiments of the present invention may be applicable to various communications systems. Therefore, the following descriptions are not limited to a specific communications system. Communications systems include: a Global System for Mobile Communications ("GSM" for short), a Code Division Multiple Access ("CDMA" for short) system, a Wideband Code Division Multiple Access ("WCDMA" for short) system, a general packet radio service ("GPRS" for short) system, a Long Term Evolution ("LTE" for short) system, an LTE frequency division duplex ("FDD" for short) system, an LTE time division duplex ("TDD" for short), a Universal Mobile Telecommunications System ("UMTS" for short), and the like. For a base station or a terminal in the foregoing systems, information or data that is coded by using a traditional Turbo code or a LDPC code may all be coded by using a Polar code in the embodiments.

Figure 1:
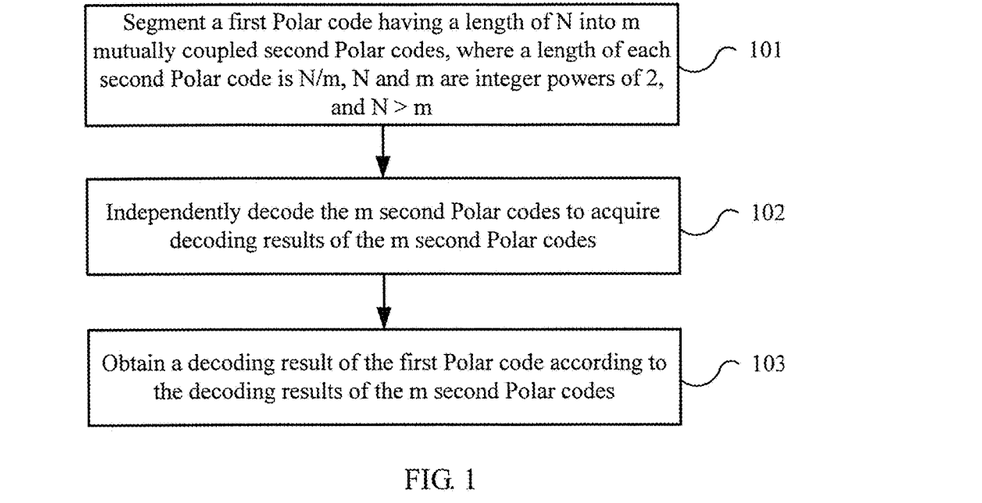
FIG. 1 is a flowchart of a Polar code decoding method according to an embodiment of the present invention.

FIG. 1 is a flowchart of a Polar code decoding method according to an embodiment of the present invention. The method in FIG. 1 may be executed by a Polar code decoder. The decoder may be disposed in a Polar code receiving device, for example, implemented by a processor in the receiving device, or implemented by a dedicated Polar decoder in the receiving device.

101. The decoder segments a first Polar code having a length of N into m mutually coupled second Polar codes, where a length of each second Polar code is N/m, N and m are integer powers of 2 and N>m.

A length of a Polar code refers to a quantity of bits included in the Polar code. The first Polar code refers to an original Polar code that needs to be decoded, and input of the first Polar code is a received signal vector, that is, $y_1^N=(y_1, y_2, \ldots, y_N)$.

The Polar code has an inner recursive structure and can be segmented into multiple mutually coupled Polar codes that have a shorter length. Optionally, in another embodiment, the received signal vector of the first Polar code may be sequentially and equally segmented into m segments, and each segment of the received signal vector is used as a received signal vector of a second Polar code.

A case in which m=2 is used as an example, as described in the foregoing, $$F^{\otimes n} = F \otimes F^{\otimes(n-1)} = \begin{bmatrix} F_{N/2} & 0 \\ F_{N/2} & F_{N/2} \end{bmatrix}.$$

Therefore, a process of coding the Polar code may be expressed as follows:

$$x_1^N = u_1^N B_N \times \begin{bmatrix} F^{\otimes(n-1)} & 0 \\ F^{\otimes(n-1)} & F^{\otimes(n-1)} \end{bmatrix}$$

$$= \begin{bmatrix} v_1^{N/2} B_{N/2} & v_{N/2+1}^N B_{N/2} \end{bmatrix} \times \begin{bmatrix} F^{\otimes(n-1)} & 0 \\ F^{\otimes(n-1)} & F^{\otimes(n-1)} \end{bmatrix},$$

where $$u_1^N B_N = \begin{bmatrix} v_1^{N/2} B_{N/2} & v_{N/2+1}^N B_{N/2} \end{bmatrix}.$$

Therefore, the Polar code having a length of N may be expressed in the following form:

$x_1^N = [a_1^{N/2} B_{N/2} F^{\otimes(n-1)} \quad b_1^{N/2} B_{N/2} F^{\otimes(n-1)}]$, where $a_1^{N/2} = v_1^{N/2} \oplus v_{N/2+1}^N$, and $b_1^{N/2} = v_{N/2+1}^N$.

Therefore, the Polar code having a length of N may be segmented into two mutually coupled Polar codes that have a length of N/2, that is, the foregoing second Polar codes. In other words, two second Polar codes that respectively have a length of N/2 may be obtained:

$$\begin{cases} x_1^{N/2} = a_1^{N/2} B_{N/2} F^{\otimes(n-1)} \\ x_{N/2+1}^N = b_1^{N/2} B_{N/2} F^{\otimes(n-1)} \end{cases}.$$

In this case, in step 101, the received signal vector $y_1^N$ of the first Polar code is segmented into two received signal vectors $y_1^{N/2}$ and $y_{N/2+1}^N$ of the second Polar codes.

Similarly, a case in which m=4 is used as an example, and the Polar code having a length of N may be expressed as follows:

$$x_1^N = u_1^N B_N \times \begin{bmatrix} F^{\otimes(n-2)} & 0 & 0 & 0 \\ F^{\otimes(n-2)} & F^{\otimes(n-2)} & 0 & 0 \\ F^{\otimes(n-2)} & 0 & F^{\otimes(n-2)} & 0 \\ F^{\otimes(n-2)} & F^{\otimes(n-2)} & F^{\otimes(n-2)} & F^{\otimes(n-2)} \end{bmatrix}.$$

It is assumed that $$u_1^N B_N = \begin{bmatrix} v_1^{N/4} B_{N/4} & v_{N/4+1}^{N/2} B_{N/4} & v_{N/2+1}^{3N/4} B_{N/4} & v_{3N/4+1}^{N} B_{N/4} \end{bmatrix},$$

$$\begin{cases} a_1^{N/4} = v_1^{N/4} \oplus v_{N/4+1}^{N/2} \oplus v_{N/2+1}^{3N/4} \oplus v_{3N/4+1}^{N} \\ b_1^{N/4} = v_{N/4+1}^{N/2} \oplus v_{3N/4+1}^{N} \\ c_1^{N/4} = v_{N/2+1}^{3N/4} \oplus v_{3N/4+1}^{N} \\ d_1^{N/4} = v_{3N/4+1}^{N} \end{cases}$$

Therefore, four second Polar codes may be obtained:

$$\begin{cases} x_1^{N/4} = a_1^{N/4} B_{N/4} F^{\otimes(n-2)} \\ x_{N/4+1}^{N/2} = b_1^{N/4} B_{N/4} F^{\otimes(n-2)} \\ x_{N/2+1}^{3N/4} = c_1^{N/4} B_{N/4} F^{\otimes(n-2)} \\ x_{3N/4+1}^{N} = d_1^{N/4} B_{N/4} F^{\otimes(n-2)} \end{cases}.$$

In this case, in step 101, the received signal vector $y_1^N$ of the first Polar code is segmented into four received signal vectors $y_1^{N/4}$, $y_{N/4+1}^{N/2}$, $y_{N/2+1}^{3N/4}$ and $y_{3N/4+1}^{N}$ of the second Polar codes.

Similarly, a case in which m=8 is used as an example, the Polar code having a length of N may be expressed as follows:

$$x_1^N = u_1^N B_N \times \begin{bmatrix} F^{\otimes(n-3)} & 0 & 0 & 0 & 0 & 0 & 0 & 0 \\ F^{\otimes(n-3)} & F^{\otimes(n-3)} & 0 & 0 & 0 & 0 & 0 & 0 \\ F^{\otimes(n-3)} & 0 & F^{\otimes(n-3)} & 0 & 0 & 0 & 0 & 0 \\ F^{\otimes(n-3)} & F^{\otimes(n-3)} & F^{\otimes(n-3)} & F^{\otimes(n-3)} & 0 & 0 & 0 & 0 \\ F^{\otimes(n-3)} & 0 & 0 & 0 & F^{\otimes(n-3)} & 0 & 0 & 0 \\ F^{\otimes(n-3)} & F^{\otimes(n-3)} & 0 & 0 & F^{\otimes(n-3)} & F^{\otimes(n-3)} & 0 & 0 \\ F^{\otimes(n-3)} & 0 & F^{\otimes(n-3)} & 0 & F^{\otimes(n-3)} & 0 & F^{\otimes(n-3)} & 0 \\ F^{\otimes(n-3)} & F^{\otimes(n-3)} & F^{\otimes(n-3)} & F^{\otimes(n-3)} & F^{\otimes(n-3)} & F^{\otimes(n-3)} & F^{\otimes(n-3)} & F^{\otimes(n-3)} \end{bmatrix}$$

It is assumed that $$u_1^N B_N = \begin{bmatrix} v_1^{N/8} B_{N/8} & v_{N/8+1}^{2N/8} B_{N/8} & v_{2N/8+1}^{3N/8} B_{N/8} & v_{3N/8+1}^{4N/8} B_{N/8} & v_{4N/8+1}^{5N/8} B_{N/8} & v_{5N/8+1}^{6N/8} B_{N/8} & v_{6N/8+1}^{7N/8} B_{N/8} & v_{7N/8+1}^{N} B_{N/8} \end{bmatrix},$$

then $$\begin{cases} a_1^{N/8} = v_1^{N/8} \oplus v_{N/8+1}^{2N/8} \oplus v_{2N/8+1}^{3N/8} \oplus v_{3N/8+1}^{4N/8} \oplus v_{4N/8+1}^{5N/8} \oplus v_{5N/8+1}^{6N/8} \oplus v_{6N/8+1}^{7N/8} \oplus v_{7N/8+1}^{N} \\ b_1^{N/8} = v_{N/8+1}^{2N/8} \oplus v_{3N/8+1}^{4N/8} \oplus v_{5N/8+1}^{6N/8} \oplus v_{7N/8+1}^{N} \\ c_1^{N/8} = v_{2N/8+1}^{3N/8} \oplus v_{3N/8+1}^{4N/8} \oplus v_{6N/8+1}^{7N/8} \oplus v_{7N/8+1}^{N} \\ d_1^{N/8} = v_{3N/8+1}^{4N/8} \oplus v_{7N/8+1}^{N} \\ e_1^{N/8} = v_{4N/8+1}^{5N/8} \oplus v_{5N/8+1}^{6N/8} \oplus v_{6N/8+1}^{7N/8} \oplus v_{7N/8+1}^{N} \\ f_1^{N/8} = v_{5N/8+1}^{6N/8} \oplus v_{7N/8+1}^{N} \\ g_1^{N/8} = v_{6N/8+1}^{7N/8} \oplus v_{7N/8+1}^{N} \\ h_1^{N/8} = v_{7N/8+1}^{N} \end{cases}$$

Therefore, eight second Polar codes may be obtained:

$$\begin{cases} x_1^{N/8} = a_1^{N/8} B_{N/8} F^{\otimes(n-3)} \\ x_{N/8+1}^{2N/8} = b_1^{N/8} B_{N/8} F^{\otimes(n-3)} \\ x_{2N/8+1}^{3N/8} = c_1^{N/8} B_{N/8} F^{\otimes(n-3)} \\ x_{3N/8+1}^{4N/8} = d_1^{N/8} B_{N/8} F^{\otimes(n-3)} \\ x_{4N/8+1}^{5N/8} = e_1^{N/8} B_{N/8} F^{\otimes(n-3)} \\ x_{5N/8+1}^{6N/8} = f_1^{N/8} B_{N/8} F^{\otimes(n-3)} \\ x_{6N/8+1}^{7N/8} = g_1^{N/8} B_{N/8} F^{\otimes(n-3)} \\ x_{7N/8+1}^{N} = h_1^{N/8} B_{N/8} F^{\otimes(n-3)} \end{cases},$$

In this case, in step 101, the received signal vector $y_1^N$ of the first Polar code is segmented into eight received signal vectors $y_1^{N/8}$, $y_{N/8+1}^{2N/8}$, $y_{2N/8+1}^{3N/8}$, ..., $y_{7N/8+1}^{N}$ of the second Polar codes.

For another value of m, the m second Polar codes may be similarly obtained, and details are not described herein again. In addition, this embodiment of the present invention sets no limitation to a manner of segmenting the Polar code. In addition to sequential and equal segmenting, another manner may also be used for segmentation as long as mutual coupling between the segmented Polar codes is ensured.

102. The decoder independently decodes the m second Polar codes to acquire decoding results of the m second Polar codes.

Each second Polar code is a Polar code having a length shorter than that of the first Polar code, and can be independently decoded to obtain m decoding results, for example, in the case in which m=2, $(a_i,b_i)$ is obtained, in the case in which m=4, $(a_i,b_i,c_i,d_i)$ is obtained, in the case in which m=8, $(a_i,b_i,c_i,d_i,e_i,f_i,g_i,h_i)$ is obtained, or the like, where i is a positive integer and $1 \le i \le N/m$. It can be learned that a decoding result of each second Polar code includes N/m decoding bits.

Optionally, the decoding in step 102 may be SC decoding. That is, SC decoding may be independently performed on the m second Polar codes to obtain the decoding results of the m second Polar codes. For example, a decision reference value (for example, a likelihood ratio, a log-likelihood ratio, or a probability value) of the $i^{th}$ bit in each second Polar code may be acquired, where i is a positive integer and $1 \le i \le N/m$, and the $i^{th}$ bit is decided according to the decision reference value to obtain a decision value of the $i^{th}$ bit. The foregoing process of acquiring the decision reference value and deciding the $i^{th}$ bit is performed sequentially, where i ranges from 1 to N/m, and the decoding results of the second Polar code may be obtained.

103. The decoder obtains a decoding result of the first Polar code according to the decoding results of the m second Polar codes.

The decoding result of the first Polar code can be obtained from the decoding results of the second Polar codes according to a correspondence between bits in the second Polar codes and the first Polar code. With reference to specific embodiments, the following further describes an exemplary process of acquiring the decoding result of the first Polar code in more details.

In this embodiment of the present invention, a Polar code having a length of N is segmented into multiple segments of mutually coupled Polar codes; the segmented Polar codes are independently decoded; and results of the independent decoding are jointly processed to obtain a decoding result of an original Polar code; in this way, there is no need to sequentially decode N bits, and flexibility of Polar code decoding can be improved.

In addition, a decoder having a length of only N/m is required in this embodiment of the present invention, and resources occupied by a single decoder and calculation complexity may be reduced; therefore, this embodiment may be flexibly applied in a scenario of limited resources.

Optionally, in an embodiment, in step 102, the m second Polar codes may be decoded in parallel to acquire the decoding results of the m second Polar codes. For example, m decoders having a length of N/m may be used to simultaneously decode the m second Polar codes. In this way, a decoding throughput can be improved and a delay can be reduced.

However, this embodiment of the present invention sets no limitation to a manner of performing step 102. For example, the m second Polar codes may also be decoded in series. For example, one decoder having a length of N/m may be used to decode the m second Polar codes in sequence. Alternatively, for example, decoding may be performed partially in parallel and partially in series. For example, in a case in which m=4, two decoders having a length of N/m may be used to separately decode two second Polar codes in series. In this way, a manner of decoding the second Polar codes can be flexibly selected according to a system resource condition and a requirement for decoding efficiency.

It should be noted that the decoder in this embodiment of the present invention may be entirely implemented by special hardware, for example, a special chip, an integrated circuit, or another firmware; or may be implemented by a general purpose processor and an instruction of the general purpose processor, where the instruction may be stored in the processor or a standalone memory. These forms all fall within the scope of this embodiment of the present invention.

Optionally, in another embodiment, in step 103, according to properties of bits that are in the first Polar code and corresponding to the $i^{th}$ bits of the m second Polar codes, decoding results of the corresponding bits in the first Polar code may be obtained.

The corresponding bits refer to original locations of the $i^{th}$ bits of the second Polar codes in the first Polar code. Input bits are used as an example for description, and it is assumed that input bits of the first Polar code are expressed as $(v_1^{N/m}, v_{N/m+1}^{2N/m}, v_{2N/m+1}^{3N/m}, \ldots, v_{N-N/m+1}^{N})$. For example, in the foregoing case in which m=2, the input bits of the first Polar code are expressed as $(v_1^{N/2}, v_{N/2+1}^{N})$, and input bits of two second Polar codes are respectively $a_1^{N/2}$ and $b_1^{N/2}$; and then a bit that is in the first Polar code and corresponding to $a_i$ is $v_i$, and a bit that is in the first Polar code and corresponding to $b_i$ is $v_{i+N/2}$. The corresponding bits may be information bits or frozen bits.

Optionally, in another embodiment, when the decoding results of the corresponding bits in the first Polar code are obtained according to the properties (that is, whether the corresponding bits are frozen bits or information bits) of the bits that are in the first Polar code and corresponding to the $i^{th}$ bits of the m second Polar codes, the decoding results of the corresponding bits may be determined in the following manners. When the corresponding bits are all information bits, the decoding results of the corresponding bits are determined according to the decision values of the $i^{th}$ bits of the m second Polar codes. When a frozen bit and an information bit exist in the corresponding bits, the decoding results of the corresponding bits are determined according to the decision reference values of the $i^{th}$ bits of the m second Polar codes or according to decision reference values of the $i^{th}$ bits of the m second Polar codes.

Optionally, in another embodiment, when the decoding results of the corresponding bits are determined according to the decision reference values of the $i^{th}$ bits of the m second Polar codes, equal-gain combining may be performed on the decision reference values of the $i^{th}$ bits of the m second Polar codes to obtain the decoding results of the corresponding bits.

Optionally, in another embodiment, when the decoding results of the corresponding bits are determined according to the decision reference values of the $i^{th}$ bits of the m second Polar codes, a likelihood ratio function value of each combination of the corresponding bits may be acquired according to the decision reference values of the $i^{th}$ bits of the m second Polar codes, and a combination that has a largest likelihood ratio function value is selected as the decoding results of the corresponding bits.

Figure 2:
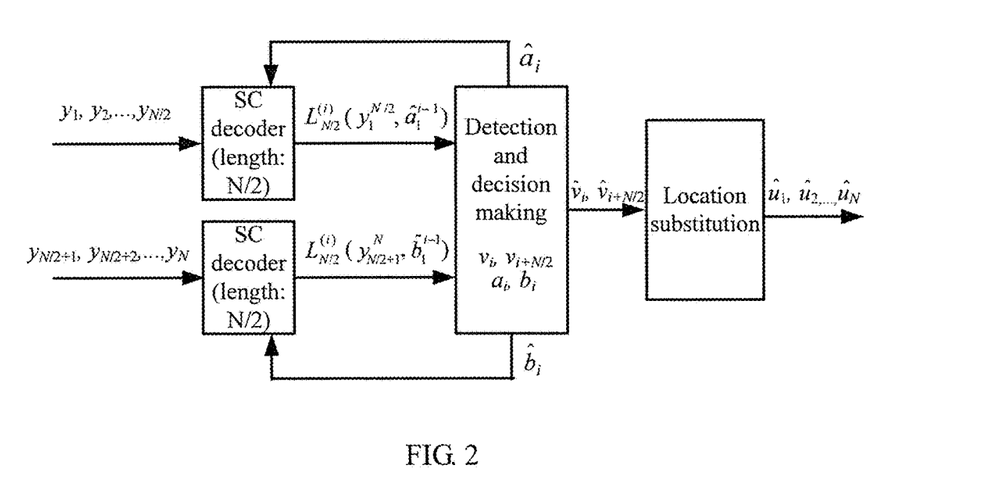
FIG. 2 is a schematic diagram of a decoding process in a case in which m=2.

With reference to specific examples, the following describes a decoding process in this embodiment of the present invention in more detail. FIG. 2 is a schematic diagram of a decoding process in a case in which m=2.

First, a Polar code having a length of N is segmented into two Polar codes having a length of N/2, that is, a former half received signal vector $y_1^{N/2}$ and a latter half received signal vector $y_{N/2+1}^{N}$. Corresponding input bits meet that:

$$\begin{cases} a_i = v_i \oplus v_{i+N/2} \\ b_i = v_{i+N/2} \end{cases} \quad 1 \le i \le N/2,$$

that is, $$\begin{cases} v_i = a_i \oplus b_i \\ v_{i+N/2} = b_i \end{cases}.$$

SC decoding may be separately performed on the two Polar codes having the length of N/2. SC decoding is performed on the first Polar code having the length of N/2, and recursive calculation is performed in sequence:

$$L_{N/2}^{(i)}(y_1^{N/2}, \hat{a}_1^{i-1}) = \ln \frac{W_{N/2}^{(i)}(y_1^{N/2}, \hat{a}_1^{i-1} \mid a_i = 0)}{W_{N/2}^{(i)}(y_1^{N/2}, \hat{a}_1^{i-1} \mid a_i = 1)}.$$

SC decoding is performed on the second Polar code having the length of N/2, and recursive calculation is performed in sequence:

$$L_{N/2}^{(i)}(y_{N/2+1}^{N}, \hat{b}_1^{i-1}) = \ln \frac{W_{N/2}^{(i)}(y_{N/2+1}^{N}, \hat{b}_1^{i-1} \mid b_i = 0)}{W_{N/2}^{(i)}(y_{N/2+1}^{N}, \hat{b}_1^{i-1} \mid b_i = 1)}.$$

In addition, decision values $\hat{a}_i$ and $\hat{b}_i$ are separately obtained.

$$\hat{a}_i = \begin{cases} 0, & \text{if } L_{N/2}^{(i)}(y_{N/2+1}^{N}, \hat{a}_1^{i-1}) \geq 0 \\ 1, & \text{otherwise} \end{cases}$$

$$\hat{b}_i = \begin{cases} 0, & \text{if } L_{N/2}^{(i)}(y_{N/2+1}^{N}, \hat{b}_1^{i-1}) \geq 0 \\ 1, & \text{otherwise} \end{cases}$$

Then, the following joint processing is performed according to the foregoing decoding result:

If $v_i$ and $v_{N/2+i}$ are both information bits, $a_i$ and $b_i$ are mutually independent; therefore, decision may be independently made:

$$\begin{cases} \hat{v}_i = \hat{a}_i \oplus \hat{b}_i \\ \hat{v}_{i+N/2} = \hat{b}_i \end{cases}.$$

If a frozen bit exists in $v_i$ and $v_{N/2+i}$, specifically, according to a definition of a Polar code, $v_i$ is a frozen bit and $v_{N/2+i}$ is an information bit, $a_i = b_i = v_{N/2+i}$, and a decision value of the information bit may be obtained by means of the following LLR equal-gain combining:

$$\hat{v}_{i+N/2} = \begin{cases} 0, & \text{if } L_{N/2}^{(i)}(y_{N/2+1}^{N}, \hat{a}_1^{i-1}) + L_{N/2}^{(i)}(y_{N/2+1}^{N}, \hat{b}_1^{i-1}) \geq 0 \\ 1, & \text{otherwise.} \end{cases}$$

The frozen bit is a fixed value, for example, 0.

After $\hat{v}_i$ and $\hat{v}_{N/2+i}$ (i=1 ... N/2) are obtained, location substitution may be performed to obtain a decoding result $u_1^N$ of the original Polar code.

In the embodiment in FIG. 2, two second Polar codes are decoded in parallel, and in this way, a decoding throughput can be improved and a delay can be reduced.

Figure 3:
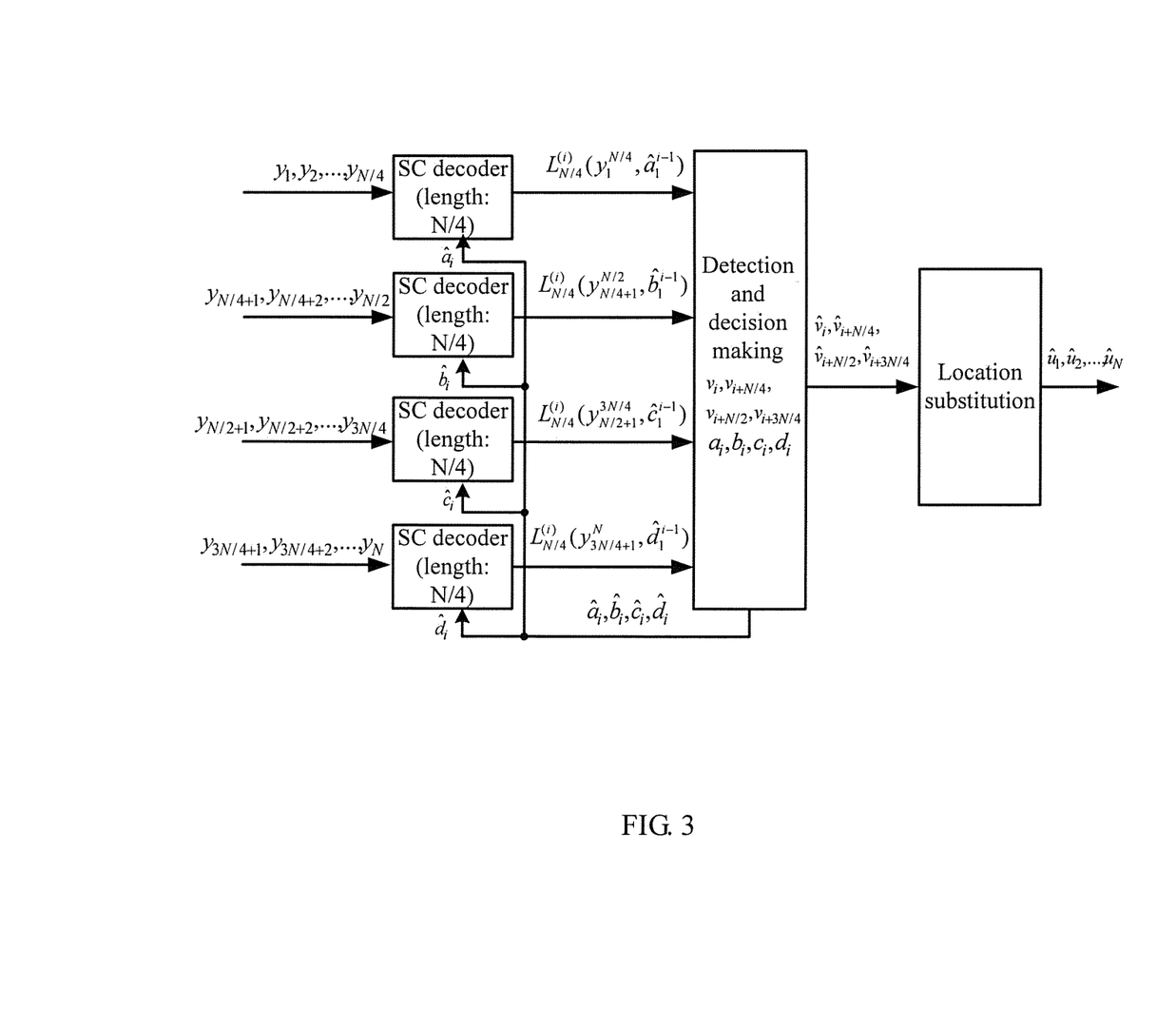
FIG. 3 is a schematic diagram of a decoding process in a case in which m=4.

FIG. 3 is a schematic diagram of a decoding process in a case in which m=4.

First, a Polar code having a length of N is segmented into four Polar codes having a length of N/4, that is, four received signal vectors $y_1^{N/4}$, $y_{N/4+1}^{N/2}$, $y_{N/2+1}^{3N/4}$, and $y_{3N/4+1}^{N}$. Corresponding input bits meet that:

$$\begin{cases} a_i = v_i \oplus v_{i+N/4} \oplus v_{i+N/2} \oplus v_{i+3N/4} \\ b_i = v_{i+N/4} \oplus v_{i+3N/4} \\ c_i = v_{i+N/2} \oplus v_{i+3N/4} \\ d_i = v_{i+3N/4} \end{cases} \quad 1 \leq i \leq N/4.$$

The following may be obtained:

$$\begin{cases} v_i = a_i \oplus b_i \oplus c_i \oplus d_i \\ v_{i+N/4} = b_i \oplus d_i \\ v_{i+N/2} = c_i \oplus d_i \\ v_{i+3N/4} = d_i \end{cases}.$$

Four component decoders (SC decoders having a length of N/4) respectively use $y_1^{N/4}$, $y_{N/4+1}^{N/2}$, $y_{N/2+1}^{3N/4}$ and $y_{3N/4+1}^{N}$ as input. The four component decoders respectively and independently calculate log-likelihood ratios: $L(a_i) = L_{N/4}^{(i)}(y_1^{N/4}, \hat{a}_1^{i-1})$, $L(b_i) = L_{N/4}^{(i)}(y_{N/4+1}^{N/2}, \hat{b}_1^{i-1})$, $L(c_i) = L_{N/4}^{(i)}(y_{N/2+1}^{3N/4}, \hat{c}_1^{i-1})$, and $L(d_i) = L_{N/4}^{(i)}(y_{3N/4+1}^{N}, \hat{d}_1^{i-1})$, and decision values, that is, $\hat{a}_i$, $\hat{b}_i$, $\hat{c}_i$, and $\hat{d}_i$ may be obtained.

A likelihood ratio function is defined as follows:
$Q(v_i, v_{i+N/4}, v_{i+N/2}, v_{i+3N/4}) = (1-2a_i)L(a_i) + (1-2b_i)L(b_i) + (1-2c_i)L(c_i) + (1-2d_i)L(d_i)$, then a combination $(v_i, v_{i+N/4}, v_{i+N/2}, v_{i+3N/4})$ that has a largest Q value may be selected as a decoding result:

$$\{\hat{v}_i, \hat{v}_{i+N/4}, \hat{v}_{i+N/2}, \hat{v}_{i+3N/4}\} = \arg \left\{ \max_{v_i, v_{i+N/4}, v_{i+N/2}, v_{i+3N/4}} [Q(v_i, v_{i+N/4}, v_{i+N/2}, v_{i+3N/4})] \right\}.$$

If $(v_i, v_{i+N/4}, v_{i+N/2}, v_{i+3N/4})$ are all information bits, the foregoing decision may be simplified as: independently deciding $(a_i, b_i, c_i, d_i)$ and using $$\begin{cases} \hat{v}_i = \hat{a}_i \oplus \hat{b}_i \oplus \hat{c}_i \oplus \hat{d}_i \\ \hat{v}_{i+N/4} = \hat{b}_i \oplus \hat{d}_i \\ \hat{v}_{i+N/2} = \hat{c}_i \oplus \hat{d}_i \\ \hat{v}_{i+3N/4} = \hat{d}_i \end{cases}$$

to obtain $\hat{v}_i, \hat{v}_{i+N/4}, \hat{v}_{i+N/2}, \hat{v}_{i+3N/4}$.

After $\hat{v}_i, \hat{v}_{i+N/4}, \hat{v}_{i+N/2}, \hat{v}_{i+3N/4}$ (i=1 ... N/4) are obtained, location substitution may be performed to obtain a decoding result $u_1^N$ of the original Polar code.

In the embodiment in FIG. 3, four second Polar codes are decoded in parallel, and in this way, a decoding throughput can be improved and a delay is reduced.

Figure 4:
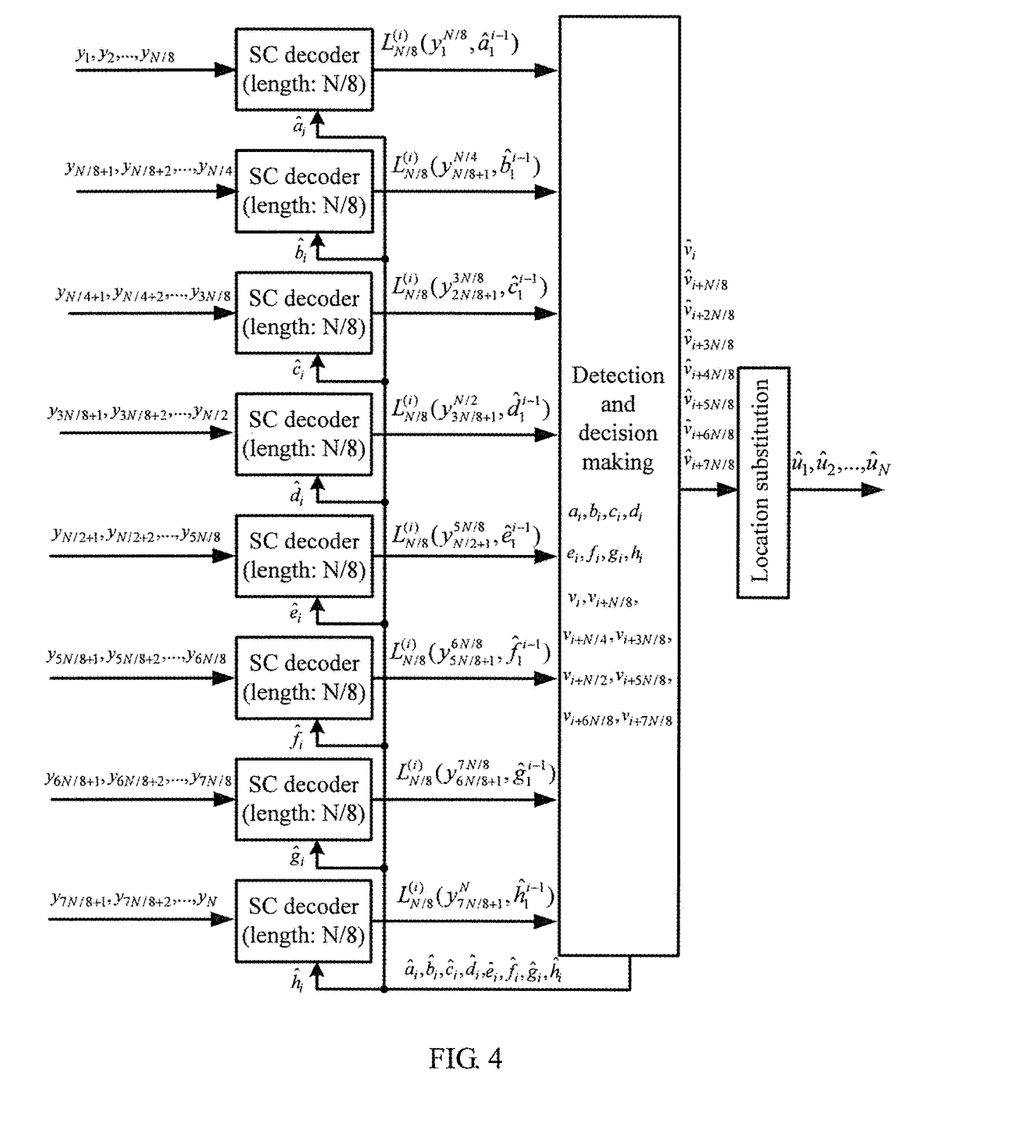
FIG. 4 is a schematic diagram of a decoding process in a case in which m=8.

FIG. 4 is a schematic diagram of a decoding process in a case in which m=8.

First, a Polar code having a length of N is segmented into eight Polar codes having a length of N/8, that is, four received signal vectors $y_1^{N/8}$, $y_{N/8+1}^{2N/8}$, $y_{2N/8+1}^{3N/8}$, ..., $y_{7N/8+1}^{N}$. Corresponding input bits meet that:

$$\begin{cases} a_i = v_i \oplus v_{i+N/8} \oplus v_{i+2N/8} \oplus v_{i+3N/8} \oplus v_{i+4N/8} \oplus v_{i+5N/8} \oplus v_{i+6N/8} \oplus v_{i+7N/8} \\ b_i = v_{i+N/8} \oplus v_{i+3N/8} \oplus v_{i+5N/8} \oplus v_{i+7N/8} \\ c_i = v_{i+2N/8} \oplus v_{i+3N/8} \oplus v_{i+6N/8} \oplus v_{i+7N/8} \\ d_i = v_{i+3N/8} \oplus v_{i+7N/8} \\ e_i = v_{i+4N/8} \oplus v_{i+5N/8} \oplus v_{i+6N/8} \oplus v_{i+7N/8} \\ f_i = v_{i+5N/8} \oplus v_{i+7N/8} \\ g_i = v_{i+6N/8} \oplus v_{i+7N/8} \\ h_i = v_{i+7N/8} \end{cases} \quad 1 \le i \le N/4.$$

Eight component decoders (SC decoders having a length of N/8) respectively use $y_1^{N/8}$, $y_{N/8+1}^{2N/8}$, $y_{2N/8+1}^{3N/8}$, ..., $y_{7N/8+1}^{N}$ as input. The eight component decoders respectively and independently calculate log-likelihood ratios: $L(a_i)=L_{N/8}^{(i)}(y_1^{N/8},\hat{a}_1^{i-1})$, $L(b_i)=L_{N/8}^{(i)}(y_{N/8+1}^{2N/8},\hat{b}_1^{i-1})$, $L(c_i)=L_{N/4}^{(i)}(y_{2N/8+1}^{3N/8},\hat{c}_1^{i-1})$, ..., $L(h_i)=L_{N/8}^{(i)}(y_{7N/8+1}^{N},\hat{h}_1^{i-1})$, and decision values, that is, $\hat{a}_i$, $\hat{b}_i$, $\hat{c}_i$, $\hat{d}_i$, $\hat{e}_i$, $\hat{f}_i$, $\hat{g}_i$, and $\hat{h}_i$ may be obtained.

A likelihood ratio function is defined as follows:

$$Q(v_i,v_{i+N/8},v_{i+2N/8}, \ldots, v_{i+7N/8})=(1-2a_i)L(a_i)+(1-2b_i)L(b_i)+(1-2c_i)L(c_i)+ \ldots +(1-2h_i)L(h_i).$$

The following may be obtained:

$$\{\hat{v}_i, \hat{v}_{i+N/8}, \hat{v}_{i+2N/8}, \ldots, \hat{v}_{i+7N/8}\} = \arg\left\{\max_{v_i,v_{i+N/8},v_{i+2N/8},\ldots,v_{i+7N/8}}[Q(v_i, v_{i+N/8}, v_{i+2N/8}, \ldots, v_{i+7N/8})]\right\}$$

If $(v_i,v_{i+N/8},v_{i+2N/8},v_{i+3N/8},v_{i+4N/8},v_{i+5N/8},v_{i+6N/8},v_{i+7N/8})$ are all information bits, the foregoing decision may be simplified as: independently deciding $(a_i,b_i,c_i,d_i,e_i,f_i,g_i,h_i)$, and then obtaining $\hat{v}_i,\hat{v}_{i+N/8},\hat{v}_{i+2N/8},\ldots,\hat{v}_{i+7N/8}$.

After $\hat{v}_i,\hat{v}_{i+N/8},\hat{v}_{i+2N/8},\ldots,\hat{v}_{i+7N/8}$ (i=1 ... N/8) are obtained, location substitution may be performed to obtain a decoding result $u_1^N$ of the original Polar code.

In the embodiment in FIG. 4, eight second Polar codes are decoded in parallel, and in this way, a decoding throughput can be improved and a delay can be reduced.

For another value of m, segmentation and independent decoding may be similarly performed, and details are not described herein again.

Cases of different N values and m values are compared according to an emulation result, and it may be found that performance of parallel SC decoding in this embodiment of the present invention is the same as performance of traditional SC decoding, but a delay is reduced and a decoding throughput is improved.

Figure 5:
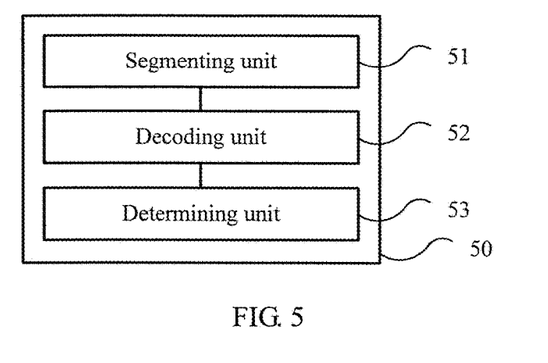
FIG. 5 is a block diagram of a Polar code decoder according to an embodiment of the present invention.

FIG. 5 is a block diagram of a Polar code decoder according to an embodiment of the present invention. A decoder 50 in FIG. 5 includes a segmenting unit 51, a decoding unit 52, and a determining unit 53.

The segmenting unit 51 segments a first Polar code having a length of N into m mutually coupled second Polar codes, where a length of each second Polar code is N/m, N and m are integer powers of 2, and N>m.

The decoding unit 52 independently decodes the m second Polar codes to acquire decoding results of the m second Polar codes.

The determining unit 53 obtains a decoding result of the first Polar code according to the decoding results of the m second Polar codes.

In this embodiment of the present invention, a Polar code having a length of N is segmented into multiple segments of mutually coupled Polar codes; the segmented Polar codes are independently decoded; and results of the independent decoding are jointly processed to obtain a decoding result of an original Polar code; in this way, there is no need to sequentially decode N bits, and flexibility of Polar code decoding can be improved.

In addition, a decoder having a length of only N/m is required in this embodiment of the present invention, and resources occupied by a single decoder and calculation complexity may be reduced; therefore, this embodiment may be flexibly applied in a scenario of limited resources.

Optionally, in an embodiment, the decoding unit 52 may include m component decoders, for example, an SC decoder shown in FIG. 2 to FIG. 4. The component decoders separately receives one second Polar code of the m second Polar codes from the segmenting unit 51, and are configured to decode the m second Polar codes in parallel to acquire the decoding results of the m second Polar codes. In this way, a decoding throughput can be improved and a delay can be reduced.

However, this embodiment of the present invention sets no limitation to a quantity of component decoders included in the decoding unit 52. For example, the decoding unit 52 may include only one component decoder that has a decoding length of N/m and decodes the m second Polar codes in series. Alternatively, for example, the decoding unit 52 may include component decoders that have a decoding length of N/m and whose quantity is less than m, where the component decoders perform decoding partially in parallel and partially in series. For example, in a case in which m=4, two decoders having a length of N/m may be used to separately decode two second Polar codes in series. In this way, a manner of decoding the second Polar codes can be flexibly selected according to a system resource condition and a requirement for decoding efficiency.

It should be noted that the decoder in this embodiment of the present invention may be entirely implemented by special hardware, for example, a special chip, an integrated circuit, or another firmware; or may be implemented by a general purpose processor and an instruction of the general purpose processor, where the instruction may be stored in the processor or a standalone memory. These forms all fall within the scope of this embodiment of the present invention.

Optionally, in another embodiment, the determining unit 53 may acquire a decision reference value of the $i^{th}$ bit in each second Polar code, where i is a positive integer, and $1 \le i \le N/m$, and decide the $i^{th}$ bit according to the decision reference value to obtain a decision value of the $i^{th}$ bit.

Optionally, in another embodiment, the determining unit 53 obtains, according to properties of bits that are in the first Polar code and corresponding to the $i^{th}$ bits of the m second Polar codes, decoding results of the corresponding bits in the first Polar code.

Optionally, in another embodiment, when the corresponding bits are all information bits, the determining unit 53 may determine the decoding results of the corresponding bits according to the decision values of the $i^{th}$ bits of them second Polar codes, for example, the foregoing embodiments in FIG. 2 to FIG. 4.

Alternatively, when a frozen bit and an information bit exist in the corresponding bits, the determining unit 53 may determine the decoding results of the corresponding bits according to the decision values of the $i^{th}$ bits of the m second Polar codes and the decision reference values (for example, the foregoing embodiments in FIG. 3 and FIG. 4) of the $i^{th}$ bits, or according to the decision reference values (for example, the foregoing embodiment in FIG. 2) of the $i^{th}$ bits of the m second Polar codes.

Optionally, in another embodiment, the determining unit 53 may perform equal-gain combining on the decision reference values of the $i^{th}$ bits of the m second Polar codes to obtain the decoding results of the corresponding bits.

Optionally, in another embodiment, the determining unit 53 may acquire a likelihood ratio function (for example, Q in the foregoing embodiments in FIG. 3 and FIG. 4) value of each combination of the corresponding bits according to the decision values of the $i^{th}$ bits of the m second Polar codes and the decision reference values of the $i^{th}$ values; and select a combination that has a largest likelihood ratio function value as the decoding results of the corresponding bits.

Optionally, in another embodiment, the decision reference value may be a likelihood ratio, a log-likelihood ratio, or a probability value.

Optionally, in another embodiment, the segmenting unit 51 may sequentially and equally segment a received signal vector of the first Polar code into m segments, and each segment of the received signal vector is used as a second Polar code.

Optionally, in another embodiment, the decoding unit 52 may independently perform SC decoding on the m second Polar codes to acquire the decoding result of the m second Polar codes.

Figure 6:
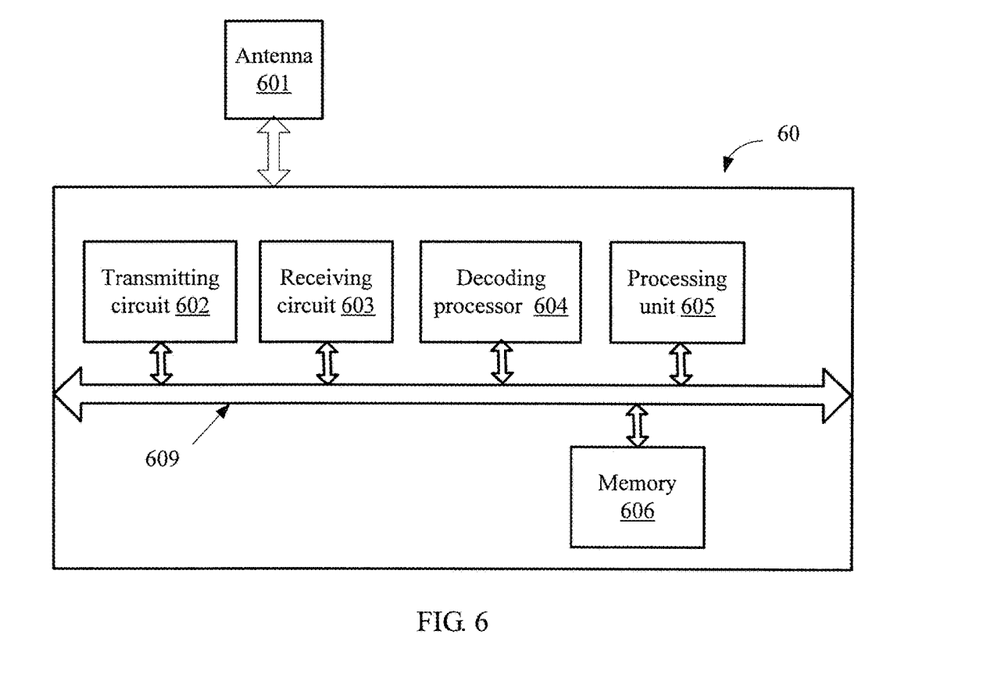
FIG. 6 is a schematic block diagram of an apparatus according to another embodiment of the present invention.

FIG. 6 is a schematic block diagram of an apparatus according to another embodiment of the present invention. An apparatus 60 in FIG. 6 may be used to implement steps and methods in the foregoing method embodiments. The apparatus 60 may be applied to a base station or a terminal in various communications systems. In the embodiment in FIG. 6, the apparatus 60 includes a transmitting circuit 602, a receiving circuit 603, a decoding processor 604, a processing unit 605, a memory 606, and an antenna 601. The processing unit 605 controls an operation of the apparatus 60, and may be configured to process a signal. The processing unit 605 may also be referred to as a CPU (Central Processing Unit, central processing unit). The memory 606 may include a read-only memory and a random access memory, and provide an instruction and data to the processing unit 605. A part of the memory 606 may further include a nonvolatile random access memory (NVRAM). In a specific application, the apparatus 60 may be built in or the apparatus 60 itself may be a wireless communications device such as a mobile phone, and the apparatus 60 may further include a carrier that accommodates the transmitting circuit 602 and the receiving circuit 603, so as to allow data transmission and receiving between the apparatus 60 and a remote location. The transmitting circuit 602 and the receiving circuit 603 may be coupled to the antenna 601. Components of the apparatus 60 are coupled together through a bus system 609, where the bus system 609 further includes a power bus, a control bus, and a status signal bus in addition to a data bus. However, for clear description, various buses are marked as the bus system 609 in the figure.

The methods disclosed in the foregoing embodiments of the present invention may be applied in the decoding processor 604, or implemented by the decoding processor 604. The decoding processor 604 may be an integrated circuit chip and has a signal processing capability. In an implementation process, the steps in the foregoing methods may be implemented by using an integrated logic circuit of hardware in the decoding processor 604 or instructions in a form of software. These instructions may be implemented and controlled by working with the processing unit 605. Configured to perform the methods disclosed in the embodiments of the present invention, the foregoing decoding processor may be a general purpose processor, a digital signal processor (DSP), an application-specific integrated circuit (ASIC), a field programmable gate array (FPGA) or another programmable logic device, a discrete gate or a transistor logic device, or a discrete hardware component. The methods, the steps, and the logical block diagrams disclosed in the embodiments of the present invention may be implemented or performed. The general purpose processor may be a microprocessor, or the processor may also be any conventional processor, decoder, or the like. Steps of the methods disclosed in the embodiments of the present invention may be directly executed by a hardware decoding processor, or by a combination of hardware and software modules in a decoding processor. The software module may be located in a mature storage medium in the field, such as a random access memory, a flash memory, a read-only memory, a programmable read-only memory, an electrically-erasable programmable memory or a register. The storage medium is located in the memory 606, and the decoding processor 604 reads information from the memory 606, and completes the steps of the foregoing methods in combination with the hardware.

Specifically, the memory 606 may store an instruction that enables the decoding processor 604 or the processing unit 605 to perform the following process:

a first Polar code having a length of N is segmented into m mutually coupled second Polar codes, where a length of each second Polar code is N/m, N and m are integer powers of 2, and N>m; the m second Polar codes are independently decoded to acquire decoding results of the m second Polar codes; and a decoding result of the first Polar code is obtained according to the decoding results of the m second Polar codes.

In this embodiment of the present invention, a Polar code having a length of N is segmented into multiple segments of mutually coupled Polar codes; the segmented Polar codes are independently decoded; and results of the independent decoding are jointly processed to obtain a decoding result of an original Polar code; in this way, there is no need to sequentially decode N bits, and flexibility of Polar code decoding can be improved.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or a part of the technical solutions may be implemented in a form of a software product. The software product is stored in a storage medium, and includes several instructions for instructing a computer device (which may be a personal computer, a server, or a network device) to perform all or a part of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A polar code decoding method in a communications device comprising a central processor and a decoding processor, the method comprising:
obtaining, by the communications device, a received signal vector of a first polar code;
segmenting, by the central processor, the received signal vector of the first polar code into m signal vectors of second polar codes, wherein m is an integer greater than 2 and the second polar codes are mutually coupled;
decoding, by the decoding processor, the m signal vectors of the second polar codes in parallel;
generating, by the decoding processor according to properties of bits that are in the first polar code and corresponding to $i^{th}$ bits of the second polar codes, decoding results of the corresponding bits in the first polar code according to the decoding results of the m signal vectors; and
outputting, by the decoding processor, a decoding result of the received signal vector of a first polar code.

2. The decoding method according to claim 1, wherein a length of the first polar code is N, a quantity of the second polar codes is m, a length of each second polar code is N/m, N is an integer power of 2, and N>m.

3. The decoding method according to claim 2, wherein:
decoding the second polar codes comprises:
acquiring a decision reference value of the $i^{th}$ bit in each second polar code, wherein i is a positive integer, and 1≤i≤N/m, and
deciding the $i^{th}$ bit according to the decision reference value to generate a decision value of the $i^{th}$ bit.

4. The decoding method according to claim 3, wherein generating decoding results of the corresponding bits in the first polar code comprises:
when the corresponding bits are all information bits, determining the decoding results of the corresponding bits according to the decision values of the $i^{th}$ bits of the second polar codes; and
when a frozen bit and an information bit exist in the corresponding bits, determining the decoding results of the corresponding bits according to the decision values of the $i^{th}$ bits of the second polar codes and the decision reference values of the $i^{th}$ bits, or determining the decoding results of the corresponding bits according to the decision reference values of the $i^{th}$ bits of the second polar codes.

5. The decoding method according to claim 4, wherein determining the decoding results of the corresponding bits comprises:
performing equal-gain combining on the decision reference values of the $i^{th}$ bits of the second polar codes to generate the decoding results of the corresponding bits.

6. The decoding method according to claim 4, wherein determining the decoding results of the corresponding bits comprises:
acquiring a likelihood ratio function value of each combination of the corresponding bits according to the decision reference values of the $i^{th}$ bits of the second polar codes; and
selecting a combination that has a largest likelihood ratio function value as the decoding results of the corresponding bits.

7. The decoding method according to claim 3, wherein the decision reference value is a likelihood ratio, a log-likelihood ratio, or a probability value.

8. The decoding method according to claim 1, wherein segmenting the received signal vector of first polar code comprises:
sequentially and equally segmenting the received signal vector of the first polar code into segments, wherein each segment of the received signal vector is used as a signal vector of one of the second polar codes to determine the second polar codes.

9. A communication device, comprising:
a receiver, configured to obtain a received signal vector of a first polar code;
a central processor, configured to segment the received signal vector of the first polar code into m signal vectors of second polar codes, wherein m is an integer greater than 2 and the second polar codes are mutually coupled; and
a decoding processor, configured to:
  decode the m signal vectors of the second polar codes in parallel, and
  generate, according to properties of bits that are in the first polar code and corresponding to $i^{th}$ bits of the second polar codes, decoding results of the corresponding bits in the first polar code according to the decoding results of the m signal vectors; and
output a decoding result of the received signal vector of a first polar code.

10. The device according to claim 9, wherein the decoding processor comprises:
component decoders, which respectively receive one signal vector of the second polar codes from the central processor, and are configured to decode the m signal vectors of the second polar codes in parallel to acquire the decoding results of the second polar codes.

11. The device according to claim 9, wherein a length of the first polar code is N, a quantity of the second polar codes is m, a length of each second polar code is N/m, N is aninteger power of 2, and N>m.

12. The device according to claim 11, wherein the decoding processor is configured to:
acquire a decision reference value of the $i^{th}$ bit in each second polar code, wherein i is a positive integer, and 1≤i≤N/m; and
decide the $i^{th}$ bit according to the decision reference value to generate a decision value of the $i^{th}$ bit.

13. The device according to claim 12, wherein the decoding processor is configured to:
when the corresponding bits are all information bits, determine the decoding results of the corresponding bits according to the decision values of the $i^{th}$ bits of the second polar codes; and
when a frozen bit and an information bit exist in the corresponding bits, determine the decoding results of the corresponding bits according to the decision values of the $i^{th}$ bits of the second polar codes and the decision reference values of the $i^{th}$ bits.

14. The device according to claim 12, wherein the decoding processor is configured to:
when the corresponding bits are all information bits, determine the decoding results of the corresponding bits according to the decision values of the $i^{th}$ bits of the second polar codes; and
when a frozen bit and an information bit exist in the corresponding bits, determine the decoding results of the corresponding bits according to the decision reference values of the $i^{th}$ bits of the second polar codes.

15. The device according to claim 12, wherein the decoding processor is configured to:
when the corresponding bits are all information bits, determine the decoding results of the corresponding bits according to the decision values of the $i^{th}$ bits of the second polar codes; and
when a frozen bit and an information bit exist in the corresponding bits, perform equal-gain combining on the decision reference values of the $i^{th}$ bits of the second polar codes to generate the decoding results of the corresponding bits.

16. The device according to claim 12, wherein the decoding processor is configured to:
when the corresponding bits are all information bits, determine the decoding results of the corresponding bits according to the decision values of the $i^{th}$ bits of the second polar codes; and
when a frozen bit and an information bit exist in the corresponding bits, acquire a likelihood ratio function value of each combination of the corresponding bits according to the decision reference values of the $i^{th}$ bits of the second polar codes, and select a combination that has a largest likelihood ratio function value as the decoding results of the corresponding bits.

17. The device according to claim 12, wherein the decision reference value is a likelihood ratio, a log-likelihood ratio, or a probability value.

18. The device according to claim 9, wherein the central processor is configured to:
sequentially and equally segment the received signal vector of the first polar code into segments, wherein each segment of the received signal vector is used as a received signal vector of one of the second polar codes to generate the second polar codes.

19. The device according to claim 9, wherein the decoding processor is configured to:
independently perform successive-cancellation (SC) decoding on the second polar codes to acquire the decoding results of the second polar codes.

* * * * *